United States Patent
Staecker et al.

(10) Patent No.: US 7,401,549 B2
(45) Date of Patent: Jul. 22, 2008

(54) ARRANGEMENT FOR TRANSFERRING INFORMATION/STRUCTURES TO WAFERS

(75) Inventors: Jens Staecker, Dresden (DE); Uwe Bruch, Dresden (DE); Heiko Hommen, Dresden (DE)

(73) Assignee: Infineon Technologies AG, Munich (DE)

( * ) Notice: Subject to any disclaimer, the term of this patent is extended or adjusted under 35 U.S.C. 154(b) by 369 days.

(21) Appl. No.: 10/802,618

(22) Filed: Mar. 17, 2004

(65) Prior Publication Data
US 2004/0219803 A1   Nov. 4, 2004

(30) Foreign Application Priority Data
Mar. 17, 2003   (DE)   ................. 103 11 855

(51) Int. Cl.
*B41F 19/02*   (2006.01)
(52) U.S. Cl. .......................................... 101/3.1; 101/4
(58) Field of Classification Search ................ 101/3.1, 101/4, 28, DIG. 36; 430/22, 302; 427/466, 427/256
See application file for complete search history.

(56) References Cited

U.S. PATENT DOCUMENTS

| | | | | | |
|---|---|---|---|---|---|
| 5,243,195 | A | * | 9/1993 | Nishi | 250/548 |
| 5,268,744 | A | * | 12/1993 | Mori et al. | 356/400 |
| 5,414,514 | A | * | 5/1995 | Smith et al. | 356/509 |
| 5,775,215 | A | * | 7/1998 | Hirate | 101/4 |
| 5,801,832 | A | * | 9/1998 | Van Den Brink | 356/500 |
| 5,866,281 | A | * | 2/1999 | Guckel et al. | 430/22 |
| 6,342,941 | B1 | * | 1/2002 | Nei et al. | 355/52 |
| 6,707,545 | B1 | * | 3/2004 | Hunter | 356/237.5 |
| 6,716,665 | B2 | * | 4/2004 | Baba et al. | 438/106 |
| 6,811,938 | B2 | * | 11/2004 | Tutt et al. | 430/22 |
| 6,916,584 | B2 | * | 7/2005 | Sreenivasan et al. | 430/22 |
| 6,975,040 | B2 | * | 12/2005 | Dower et al. | 257/797 |
| 7,139,083 | B2 | * | 11/2006 | Fielden et al. | 356/630 |
| 2001/0026638 | A1 | * | 10/2001 | Sangu et al. | 382/151 |

(Continued)

FOREIGN PATENT DOCUMENTS

WO   WO 02/067055 A2   8/2002

(Continued)

OTHER PUBLICATIONS

White, D.L., et al., "Novel Alignment System for Imprint Lithography," J. Vac. Sci. Technol. B vol. 18, No. 6, Nov./Dec. 2000, pp. 3552-3556.

(Continued)

*Primary Examiner*—Anthony H. Nguyen
(74) *Attorney, Agent, or Firm*—Slater & Matsil, L.L.P.

(57) ABSTRACT

An arrangement for transferring information/structures to wafers uses a stamp on which the information/structures to be transferred have been applied as elevated structures. The wafer is fixed on a chuck and is provided with a plastically deformable auxiliary patterning layer. In various implementations, the dimensions of the stamp approximately correspond to those of the wafer, the stamp is provided with the elevated structures essentially over the whole area, and/or the stamp and the wafer are in each case provided with mutually assigned pairs of alignment marks in such a way that the stamp can be positioned in a predetermined position on the wafer by means of an infrared positioning system and can be pressed into the plastically deformable auxiliary patterning layer.

28 Claims, 6 Drawing Sheets

U.S. PATENT DOCUMENTS

| | | | |
|---|---|---|---|
| 2001/0026897 A1* | 10/2001 | Shima | 430/22 |
| 2002/0037460 A1* | 3/2002 | Takahashi | 430/22 |
| 2002/0076896 A1* | 6/2002 | Farrar et al. | 438/401 |
| 2002/0115002 A1* | 8/2002 | Bailey et al | 430/5 |
| 2002/0163054 A1* | 11/2002 | Suda | 257/431 |
| 2002/0170880 A1 | 11/2002 | Chen | |
| 2004/0021254 A1 | 2/2004 | Sreenivasan et al. | |
| 2004/0021866 A1 | 2/2004 | Watts et al. | |
| 2004/0022888 A1 | 2/2004 | Sreenivasan et al. | |
| 2004/0023466 A1* | 2/2004 | Yamauchi | 438/401 |

FOREIGN PATENT DOCUMENTS

| | | |
|---|---|---|
| WO | WO 2004/013693 A2 | 2/2004 |

OTHER PUBLICATIONS

Deng, Y., et al., "Simulation of Exposure and Alignment for Nano-imprint Lithography," Proceedings of the SPIE, The International Society for Optical Engineering, USA, 2002, vol. 4688, No. 1-2, pp. 842-849.

* cited by examiner

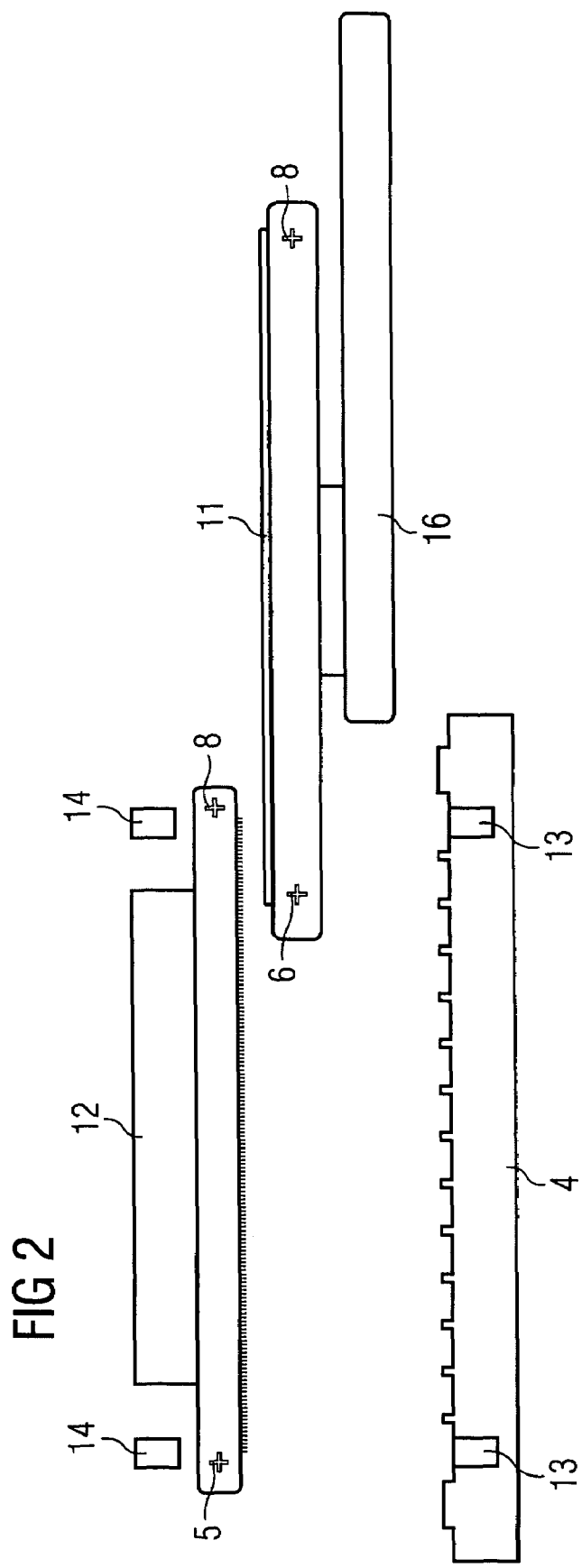

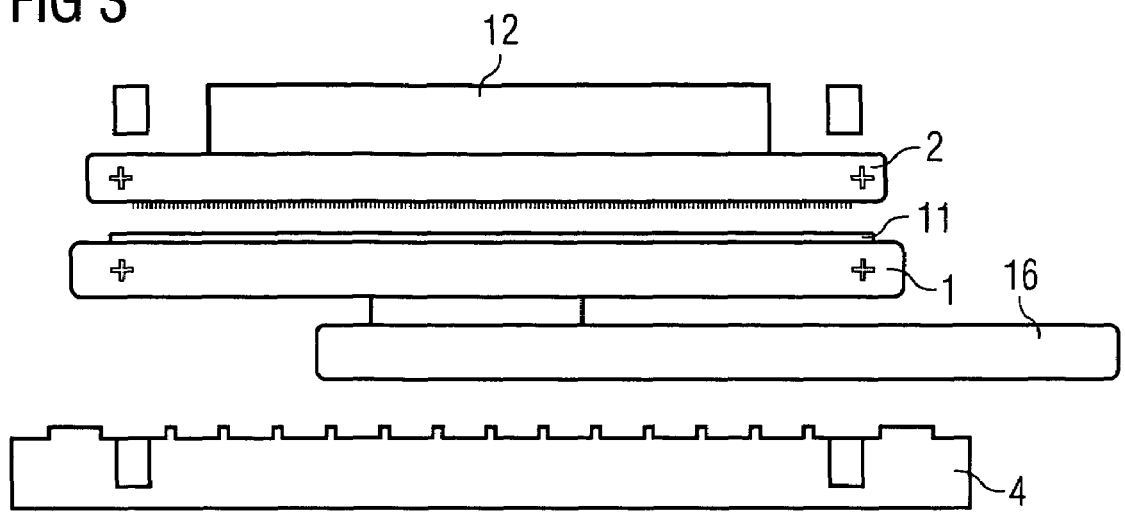
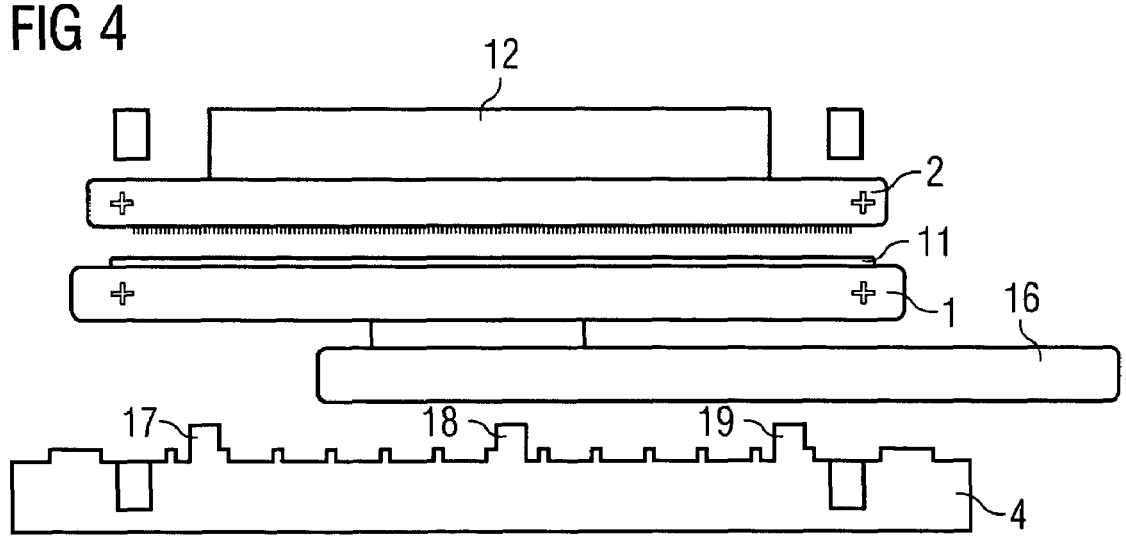

ARRANGEMENT FOR TRANSFERRING INFORMATION/STRUCTURES TO WAFERS

TECHNICAL FIELD

The present invention relates generally to semiconductor manufacturing and an arrangement for transferring information/structures to wafers.

BACKGROUND

Nano—or imprint lithography is used to transfer information or structures to a wafer by means of a metal or polymer stamp in that the stamp, which is provided with the corresponding information, is simply pressed into a soft auxiliary patterning layer situated on the wafer, e.g. a polymer layer, and the layer is thus correspondingly patterned. Imprint lithography, which can be used for feature sizes of around 50 nm, substantially simplifies the patterning of surfaces and can replace photolithography that is used otherwise.

The information/structures to be transferred are produced on the stamp by means of one of the known electron beam or laser lithography or optical lithography in conjunction with customary etching methods. In this case, the dimensions of the stamp correspond to those of a chip to be fabricated on the wafer. It emerges from this that the stamp in each case has to be positioned above a chip and oriented precisely. The stamp is then pressed into the auxiliary patterning layer, the information/structure being transferred into the latter. This operation is to be repeated until the entire wafer has been scanned in a manner similar to a wafer stepper.

This operation is very time-consuming and requires a precise prealignment of the wafer and then of the stamp relative to the wafer. Moreover, structures in the 50 nm range have to be realized on the stamp, which requires a very sophisticated photolithography. That leads to considerable costs, especially as the stamps are indeed subject to a certain degree of wear.

SUMMARY OF THE INVENTION

The preferred embodiment of the present invention provides an arrangement for transferring information/structures to wafers in a manner that can be realized cost-effectively. In one aspect, the invention relates to an arrangement for transferring information/structures to wafers using a stamp on which the information/structures to be transferred have been applied as elevated structures by means of suitable methods, for example a photolithographic method in conjunction with an etching method, and the wafer fixed on a chuck being provided with a plastically deformable auxiliary patterning layer.

In the case of an arrangement of the type mentioned in the background, advantage can be achieved by virtue of the fact that the dimensions of the stamp approximately correspond to those of the wafer. For example, the stamp is provided with the elevated information/structures essentially over the whole area and the stamp and the wafer are in each case provided with mutually assigned pairs of alignment marks in such a way that the stamp can be positioned in a predetermined position on the wafer by means of an infrared positioning system and can be pressed into the plastically deformable auxiliary patterning layer.

The preferred embodiment of the invention achieves a significant reduction in the costs of fabrication of the stamps and at the same time obviates one complete photolithography step. A significant cost saving is thus also achieved in wafer production.

In one particular embodiment of the invention, the alignment mark in the stamp and in the wafer are embodied as buried metal marks, the metal marks in the wafer being arranged in the first structure plane or metal plane.

The alignment marks are preferably in each case arranged in the edge region of the stamp and of the wafer, care being taken to ensure that the alignment marks are not concealed again by metal interconnects of further metallization planes in the course of further layer construction.

In a further refinement of the invention, each pair of alignment marks is assigned an infrared laser situated in the chuck and, above the stamp, an infrared camera.

A further embodiment of the invention provides for the stamp to be fixed to a stamp mount which can be positioned three-dimensionally in the X, Y and Z directions. As an alternative, the stamp may be fixed to a stamp mount which can be positioned two-dimensionally in the X and Y directions, the chuck being vertically movable.

Finally, the chuck is provided with an acceptance/transfer device for accepting/transferring a respective wafer from/to a handler, the acceptance/transfer device comprising preferably three pins which can be extended from the chuck from below against the wafer. A handler is to be understood to be a manipulator which can be used to take up individual wafers and transport them to the acceptance/transfer device.

It is thus possible to position the wafer with the aid of the handler after a prealignment in the φ direction positionally correctly above the pins, which then accept/support the wafer, so that the handler can be removed again from the transfer/acceptance region above the chuck and the wafer can be deposited on the chuck and fixed by application of a vacuum. Afterwards, the stamp is then oriented with respect to the wafer with the aid of the alignment marks and the infrared (IR) positioning system and is pressed into the auxiliary patterning layer situated on the wafer, or the chuck is moved upwards against the stamp. During this operation, the elevated information/structure on the stamp is imaged as a negative structure in the auxiliary patterning layer.

Finally, one refinement of the invention provides for the stamp to comprise a silicon wafer, so that the elevated patterning can be fabricated very cost-effectively by means of customary lithographic methods in conjunction with etching methods.

BRIEF DESCRIPTION OF THE DRAWINGS

The invention is explained in more detail below using an exemplary embodiment. In the associated drawings:

FIGS. 2-4 show a sequence illustrating the positioning of a wafer between a chuck and a stamp situated above it;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
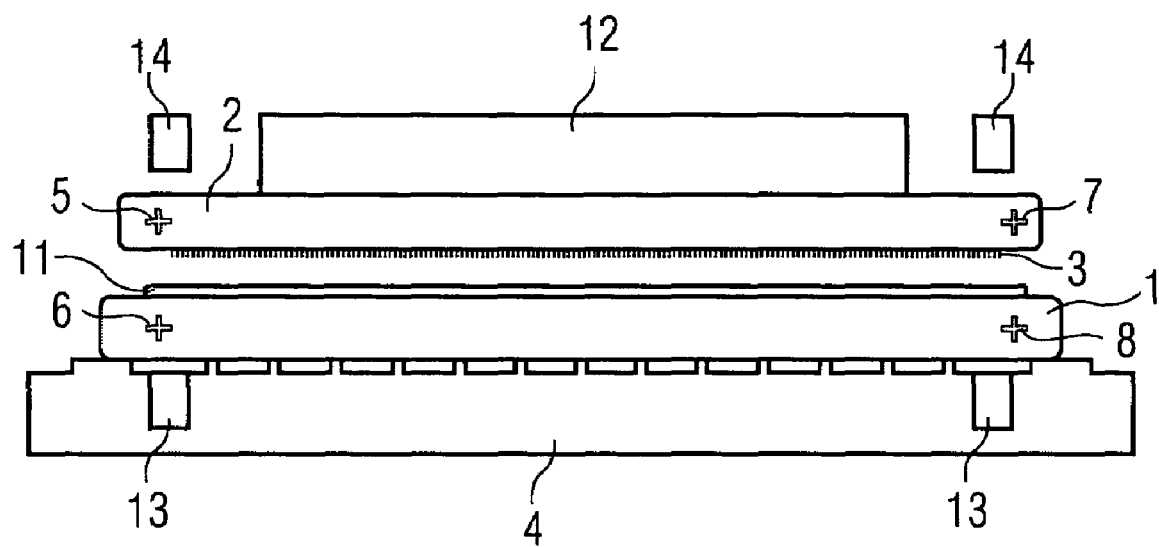
FIG. 1 shows a diagrammatic illustration of an arrangement according to the invention for transferring information/structures to wafers.
Figure 5:
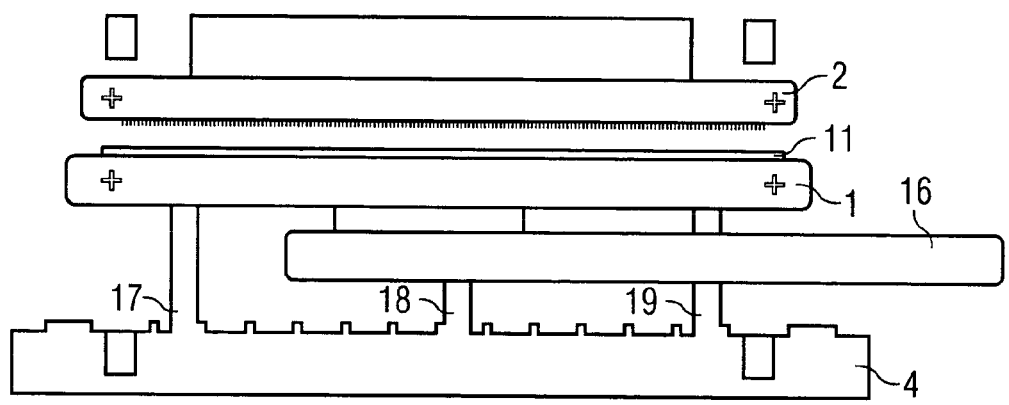
FIGS. 5-7 show a sequence illustrating the acceptance of the wafer by pins which can be extended from the chuck.
Figure 6:
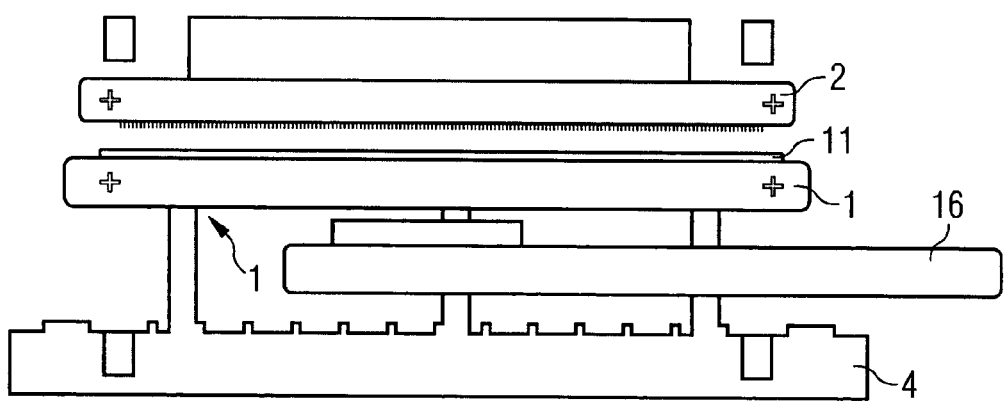
Figure 7:
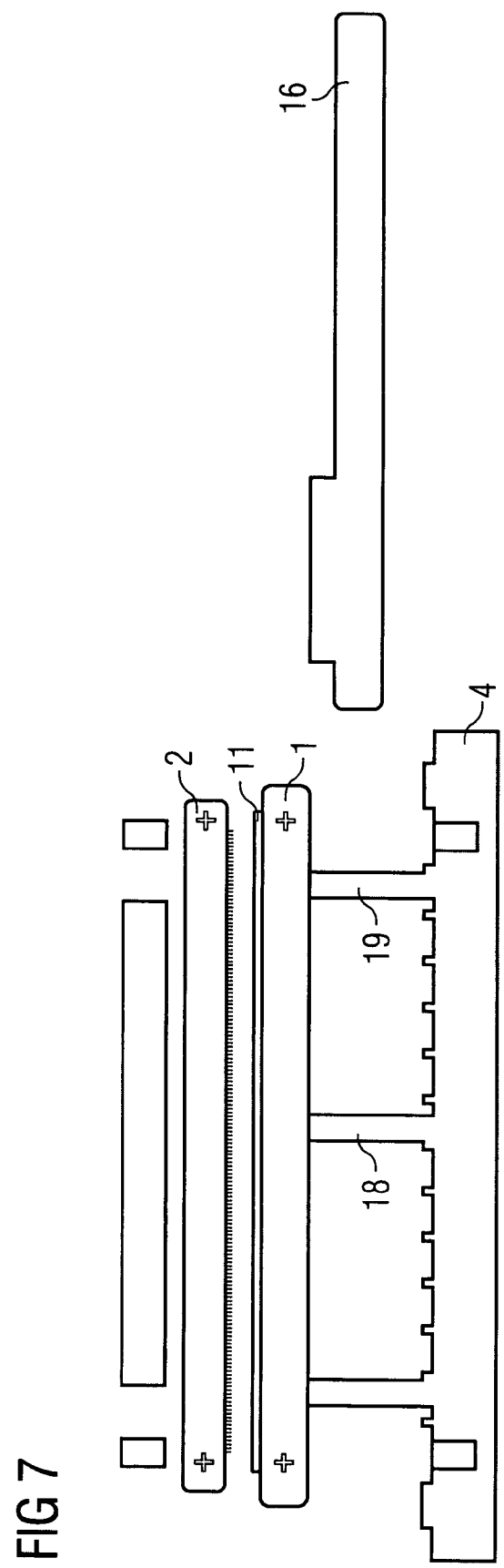

In accordance with FIG. 1, the arrangement for transferring information/structures to wafers 1 comprises a stamp 2 with an elevated structure 3, the dimensions of the stamp 2 approximately corresponding to those of the wafer 1. For example, the wafer 1 and the stamp 2 may have a diameter of about 200 mm (about 8 inches) or a diameter of about 300 mm (about 12 inches). It is anticipated that larger wafers 1, and therefore stamps 2, will be commercially available in the future.

The stamp 2 may comprise an silicon wafer, so that the elevated structure 3 can be fabricated by means of customary lithographic methods in conjunction with etching methods. As an alternative, the stamp 2 may also be fabricated from a plastic, for example a polymer, another semiconductor, for example germanium or gallium arsenide, or another material, for example quartz or sapphire.

The elevated structures 3 correspond to features that are to be transferred to the wafer 1. Accordingly, at least some of these structures 3 are preferably less than 0.1 µm. For example, at least some of the structures 3 can be 50 nm or less in their smallest dimension parallel to the main surface of the wafer 1.

The wafer 1, to which the information/structure is to be transferred from the stamp 2 is fixed on a chuck 4 by application of a vacuum. Furthermore, the stamp 2 and the wafer 1 are provided with mutually assigned pairs of alignment marks 5, 6, 7, 8, so that the stamp 2 can be positioned in a predetermined position on the wafer 1 by means of an IR positioning system.

In order that the information/structure situated on the stamp 2 can be transferred to an auxiliary patterning layer 11 situated on the wafer, e.g. a plastically deformable auxiliary patterning layer such as a polymer layer or a resist, the stamp 2 is fixed to a preferably three-dimensionally movable stamp mount 12. The transfer of the information/structures from the stamp 2 to the auxiliary patterning layer 11 can then be effected simply by the elevated structure 3 of the stamp 2 being pressed into the auxiliary patterning layer 11, so that the structure 3 is imaged as a negative structure.

In the preferred embodiment, the alignment marks 5, 6, 7, 8 are embodied as buried metal marks in the stamp 2 and in the wafer 1, the metal marks in the wafer 1 being situated in the first structure plane or metal plane. The alignment marks 5, 6, 7, 8 are in each case arranged in the edge region of the stamp 2 and of the wafer 1 in a manner to take account of the fact that the alignment marks 5, 6, 7, 8 are not concealed again by metal interconnects/metal layers of further metallization planes in the course of further layer construction on the wafer 1.

In order now to enable a precise orientation of the stamp 2 with respect to the wafer 1, the IR positioning system in each case comprises an IR laser 13 in the chuck 4 and an IR camera 14 above the stamp 2.

As shown in FIGS. 2-7, there is situated between the chuck 4 and the stamp 2 a transfer/acceptance region for transferring/accepting a respective wafer 1 from/to a handler 16. Three pins 17, 18, 19 which can be extended from the chuck 4 from below against the wafer 1 are provided for the acceptance/transfer. FIGS. 2-4, which show a sequence illustrating the positioning of the wafer 1 between the chuck 4 and the stamp 2 and FIGS. 5-7, which show a sequence illustrating the acceptance of the wafer 1 by pins 17, 18, 19 that can be extended from the chuck 4.

Thus, the wafer 1 can be positioned with the aid of the handler 16 after a prealignment in the ϕ direction positionally correctly above the pins 17, 18, 19 (FIGS. 2, 3), which then accept/support the wafer (FIGS. 4, 5, 6), so that the handler 16 can be removed again from the transfer/acceptance region 15 above the chuck (FIG. 7) and the wafer 1 can be deposited on the chuck 4 and fixed by application of a vacuum.

Figure 8:
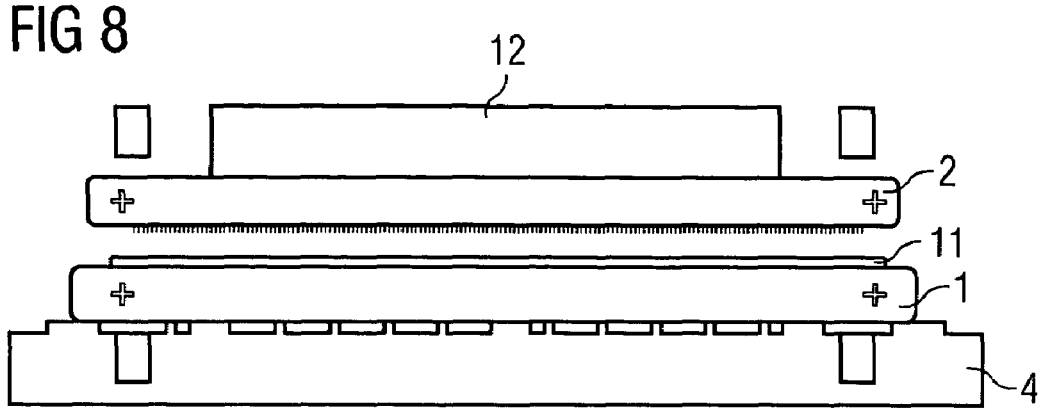
FIGS. 8-10 show a sequence illustrating the transfer of the information/structures of the stamp to the wafer fixed on the chuck.
Figure 9:
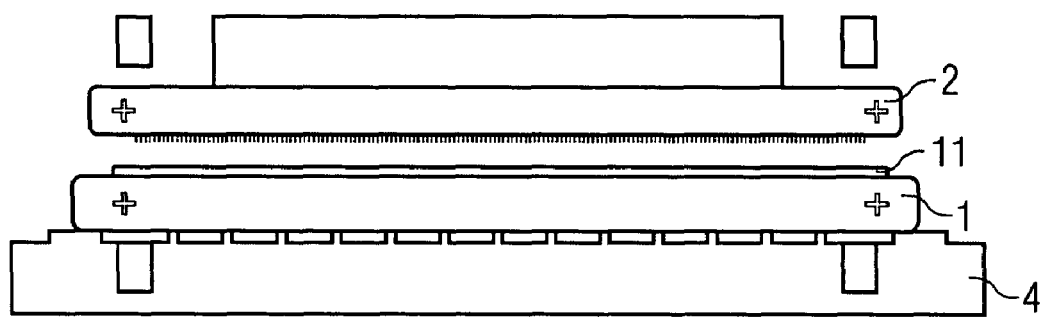
Figure 10:
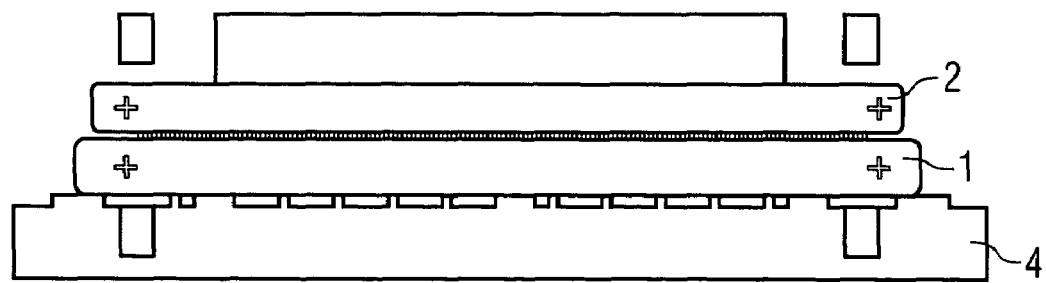

FIGS. 8-10 show a sequence illustrating the transfer of the information structures of the stamp 2 to the wafer 1 fixed on the chuck 4. Referring to these figures, the stamp 2 is then oriented with respect to the wafer 1 with the aid of the alignment marks 5, 6, 7, 8 and the IR positioning system 9, 10 and pressed into the auxiliary patterning layer 11 situated on the wafer 1 (FIGS. 9, 10), or the chuck 4 is moved upwards against the stamp 2 (FIGS. 8, 10).

The plastically deformable auxiliary patterning layer (11) may comprise a polymer, a resist, or another suitable material.

The preferred embodiment of the invention achieves a significant reduction of the costs in the fabrication of the stamps 2 and at the same time obviates one complete photolithography step on the wafer. A significant cost saving is thus also achieved in wafer production.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An arrangement for use in transferring information/structures to wafers using a stamp, the arrangement comprising:
   a chuck;
   a wafer fixed on the chuck, the wafer being provided with a patterning layer on a main surface thereof;
   a stamp including elevated structures on a main surface, the elevated structures serving as information/structures to be transferred to the patterning layer on the wafer, wherein dimensions of the main surface of the stamp approximately correspond to dimensions of the main surface of the wafer, wherein the stamp is provided with the elevated structures essentially over the entire main surface, and wherein the stamp and the wafer each include a plurality of mutually assigned pairs of alignment marks;
   a positioning system comprising a plurality of infrared light sources and a plurality of infrared cameras, wherein each mutually assigned pair of alignment marks is illuminated by an infrared light source and is monitored by a corresponding infrared camera, and wherein the stamp is positioned on the wafer by means of the positioning system and is pressed into the patterning layer.

2. The arrangement of claim 1 wherein the alignment marks in the stamp and in the wafer are embodied as buried metal marks.

3. The arrangement of claim 2 wherein the alignment marks in the stamp are arranged in an edge region of the stamp and wherein the alignment marks in the wafer are arranged in an edge region of the wafer.

4. The arrangement of claim 1 wherein each infrared light source comprises an infrared laser.

5. The arrangement of claim 1 wherein the stamp is fixed to a three-dimensionally positionable stamp mount.

6. The arrangement of claim 1 wherein the stamp is fixed to a stamp mount that can be positioned two-dimensionally in the X and Y directions, and wherein the chuck is vertically movable.

7. The arrangement of claim 1 wherein the chuck is provided with an acceptance/transfer device for accepting/transferring the wafer from/to a handler.

8. The arrangement of claim 7 wherein the acceptance/transfer device comprises at least three pins that extend from the chuck and contact a lower surface of the wafer.

9. The arrangement of claim 1 wherein the stamp comprises a silicon wafer.

10. The arrangement of claim 1 wherein the patterning layer comprises a polymer.

11. The arrangement of claim 1 wherein the patterning layer comprises a resist.

12. The arrangement of claim 1 wherein the patterning layer comprises a plastically deformable auxiliary patterning layer.

13. The arrangement of claim 1 wherein the elevated structures comprise structures embedded in the stamp by use of a photolithographic process in conjunction with an etching process.

14. A method of manufacturing a semiconductor wafer, the method comprising:
   positioning a semiconductor wafer on a chuck, the semiconductor wafer including alignment marks formed thereon and a patterning layer formed thereon;
   aligning the wafer in a φ direction;
   after aligning the wafer in the φ direction, positioning a stamp over the semiconductor wafer, the stamp including a plurality of elevated structures disposed on an upper surface thereof and corresponding to a pattern to be applied to the patterning layer of the wafer, the stamp further including alignment marks that correspond to the alignment marks of the semiconductor wafer, the stamp having a diameter dimension that approximately corresponds to a diameter dimension of the semiconductor wafer;
   aligning the stamp with the wafer by use of the alignment marks of the semiconductor wafer and of the stamp, wherein aligning the stamp comprises positioning the stamp on the semiconductor wafer by means of an infrared positioning system, and wherein the infrared positioning system includes a plurality of infrared light sources and a plurality of infrared cameras, wherein each alignment mark on the stamp is aligned with a corresponding alignment mark on the semiconductor wafer using one of the infrared light sources to illuminate the corresponding alignment mark and one of the infrared cameras to monitor the corresponding alignment marks; and
   physically contacting the elevated structures of the stamp with the patterning layer of the semiconductor wafer.

15. The method of claim 14 wherein the stamp includes elevated structures essentially over the entire upper surface of the stamp.

16. The method of claim 14 wherein the stamp is fixed to a three-dimensionally positionable stamp mount and wherein aligning the stamp with the wafer comprises moving the stamp while the wafer remains stationary.

17. The method of claim 14 wherein the stamp is fixed to a stamp mount and wherein aligning the stamp with the wafer comprises moving the stamp two-dimensionally in the X and Y directions and moving the chuck vertically.

18. The method of claim 14 wherein the chuck is provided with an acceptance/transfer device for accepting/transferring the wafer from/to a handler.

19. The method of claim 18 wherein the acceptance/transfer device comprises at least three pins that extend from the chuck and contact a lower surface of the wafer.

20. The arrangement according to claim 1 wherein the stamp comprises:
   a substrate having a diameter of at least about 200 mm;
   at least a portion of the elevated structures having a dimension of 0.1 µm or less.

21. The arrangement according to claim 20 wherein at least one feature has a feature size of no greater than 50 nm.

22. The arrangement according to claim 1 wherein the stamp comprises buried alignment marks.

23. The arrangement according to claim 22 wherein the alignment marks are arranged in a periphery region of the substrate.

24. The arrangement according to claim 1 wherein the alignment marks are arranged in a periphery region of the substrate.

25. The arrangement according to claim 1 wherein the substrate comprises a silicon wafer.

26. The arrangement according to claim 25 wherein the substrate has a diameter of about or more than 300 mm.

27. The arrangement according to claim 2 wherein the alignment marks are arranged in a periphery region of the substrate.

28. The method of claim 14 wherein each infrared light source comprises an infrared laser.

* * * * *